United States Patent
Sharma et al.

(10) Patent No.: US 11,415,679 B2
(45) Date of Patent: Aug. 16, 2022

(54) SPAD ARRAY WITH GATED HISTOGRAM CONSTRUCTION

(71) Applicant: Apple Inc., Cupertino, CA (US)

(72) Inventors: Anup K. Sharma, Sunnyvale, CA (US); Arnaud Laflaquière, Singapore (SG); Gennadiy A. Agranov, San Jose, CA (US); Gershon Rosenblum, Fremont, CA (US); Shingo Mandai, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/752,653

(22) Filed: Jan. 26, 2020

(65) Prior Publication Data

US 2020/0158837 A1  May 21, 2020

Related U.S. Application Data

(63) Continuation of application No. 14/830,760, filed on Aug. 20, 2015, now Pat. No. 10,620,300.

(51) Int. Cl.
*G01S 7/4865* (2020.01)
*H01L 31/02* (2006.01)
(Continued)

(52) U.S. Cl.
CPC ............ *G01S 7/4865* (2013.01); *G01S 7/483* (2013.01); *G01S 7/4863* (2013.01); *G01S 17/10* (2013.01);
(Continued)

(58) Field of Classification Search
CPC . H01L 31/02027; G01S 17/10; G01S 7/4863; G01S 7/483; G01S 17/894; G01S 17/18; G01S 7/4865; G04F 10/005
(Continued)

(56) References Cited

U.S. PATENT DOCUMENTS 4,623,237 A  11/1986 Kaneda et al.
5,699,149 A  12/1997 Kuroda et al.
(Continued)

FOREIGN PATENT DOCUMENTS

CN  105992960 A  10/2016
EP  2322953 A1  5/2011
(Continued)

OTHER PUBLICATIONS

U.S. Appl. No. 15/586,286 office action dated Dec. 2, 2019.
(Continued)

*Primary Examiner* — Georgia Y Epps
*Assistant Examiner* — Kevin Wyatt
(74) *Attorney, Agent, or Firm* — Kligler & Associates Patent Attorneys Ltd (57) ABSTRACT

A sensing device includes a first array of sensing elements, which output a signal indicative of a time of incidence of a single photon on the sensing element. A second array of processing circuits are coupled respectively to the sensing elements and comprise a gating generator, which variably sets a start time of the gating interval for each sensing element within each acquisition period, and a memory, which records the time of incidence of the single photon on each sensing element in each acquisition period. A controller sets, in each of at least some of the acquisition periods, different, respective gating intervals for different ones of the sensing elements.

18 Claims, 5 Drawing Sheets

(51) Int. Cl.
   *G01S 7/483* (2006.01)
   *G04F 10/00* (2006.01)
   *G01S 17/10* (2020.01)
   *G01S 7/4863* (2020.01)
   *G01S 17/18* (2020.01)
   *G01S 17/894* (2020.01)

(52) U.S. Cl.
   CPC ............ *G01S 17/18* (2020.01); *G01S 17/894* (2020.01); *G04F 10/005* (2013.01); *H01L 31/02027* (2013.01)

(58) Field of Classification Search
   USPC ...................................................... 250/208.1
   See application file for complete search history.

(56) References Cited

U.S. PATENT DOCUMENTS

| | | | |
|---|---|---|---|
| 6,710,859 | B2 | 3/2004 | Shirai et al. |
| 7,193,690 | B2 | 3/2007 | Ossig et al. |
| 7,508,496 | B2 | 3/2009 | Mettenleiter et al. |
| 7,800,739 | B2 | 9/2010 | Rohner et al. |
| 7,969,558 | B2 | 6/2011 | Hall |
| 8,675,181 | B2 | 3/2014 | Hall |
| 8,925,814 | B1 | 1/2015 | Schneider et al. |
| 9,465,111 | B2 | 10/2016 | Wilks et al. |
| 9,709,678 | B2 | 7/2017 | Matsuura |
| 9,761,049 | B2 | 9/2017 | Naegle et al. |
| 9,786,701 | B2 | 10/2017 | Mellot et al. |
| 10,269,104 | B2 | 4/2019 | Hannuksela et al. |
| 10,424,683 | B1* | 9/2019 | Do Valle .............. G01S 7/4861 |
| 2002/0071126 | A1 | 6/2002 | Shirai et al. |
| 2002/0154054 | A1 | 10/2002 | Small |
| 2004/0135992 | A1 | 7/2004 | Munro |
| 2007/0145136 | A1 | 6/2007 | Wiklof et al. |
| 2009/0262760 | A1 | 10/2009 | Krupkin et al. |
| 2009/0273770 | A1 | 11/2009 | Bauhahn et al. |
| 2009/0275841 | A1 | 11/2009 | Melendez et al. |
| 2010/0096459 | A1 | 4/2010 | Gurevich |
| 2010/0121577 | A1 | 5/2010 | Zhang et al. |
| 2010/0250189 | A1 | 9/2010 | Brown |
| 2010/0286516 | A1 | 11/2010 | Fan et al. |
| 2011/0006190 | A1 | 1/2011 | Alameh et al. |
| 2012/0294422 | A1 | 11/2012 | Cheung et al. |
| 2013/0107016 | A1 | 5/2013 | Federspiel |
| 2013/0236171 | A1 | 9/2013 | Saunders |
| 2013/0278917 | A1 | 10/2013 | Korekado et al. |
| 2014/0027606 | A1 | 1/2014 | Raynor et al. |
| 2014/0077086 | A1 | 3/2014 | Batkilin et al. |
| 2014/0240317 | A1 | 8/2014 | Go et al. |
| 2014/0240691 | A1 | 8/2014 | Mheen et al. |
| 2014/0268127 | A1 | 9/2014 | Day |
| 2014/0300907 | A1 | 10/2014 | Kimmel |
| 2015/0062558 | A1 | 3/2015 | Koppal et al. |
| 2015/0131080 | A1 | 5/2015 | Retterath et al. |
| 2015/0260830 | A1 | 9/2015 | Ghosh et al. |
| 2015/0362585 | A1 | 12/2015 | Ghosh et al. |
| 2016/0003944 | A1 | 1/2016 | Schmidtke et al. |
| 2016/0072258 | A1 | 3/2016 | Seurin et al. |
| 2016/0080709 | A1 | 3/2016 | Viswanathan et al. |
| 2016/0334508 | A1* | 11/2016 | Hall ...................... G01S 7/4915 |
| 2016/0344965 | A1* | 11/2016 | Grauer ............... H04N 5/35536 |
| 2017/0038459 | A1 | 2/2017 | Kubacki et al. |
| 2017/0067734 | A1 | 3/2017 | Heidemann et al. |
| 2017/0139041 | A1 | 5/2017 | Drader et al. |
| 2017/0184704 | A1 | 6/2017 | Yang et al. |
| 2017/0184709 | A1 | 6/2017 | Kenzler et al. |
| 2017/0219695 | A1 | 8/2017 | Hall et al. |
| 2017/0242102 | A1 | 8/2017 | Dussan et al. |
| 2017/0242108 | A1 | 8/2017 | Dussan et al. |
| 2017/0269209 | A1 | 9/2017 | Hall et al. |
| 2017/0303789 | A1 | 10/2017 | Tichauer et al. |
| 2017/0343675 | A1 | 11/2017 | Oggier et al. |
| 2017/0356981 | A1 | 12/2017 | Yang et al. |
| 2018/0062345 | A1 | 3/2018 | Bills et al. |
| 2018/0115762 | A1 | 4/2018 | Bulteel et al. |
| 2018/0131449 | A1 | 5/2018 | Kare et al. |
| 2018/0205943 | A1 | 7/2018 | Trail |
| 2018/0209846 | A1 | 7/2018 | Mandai et al. |
| 2019/0011556 | A1 | 1/2019 | Pacala et al. |
| 2019/0011567 | A1 | 1/2019 | Pacala et al. |
| 2019/0018117 | A1 | 1/2019 | Perenzoni et al. |
| 2019/0018118 | A1 | 1/2019 | Perenzoni et al. |
| 2019/0018143 | A1 | 1/2019 | Thayer et al. |
| 2019/0037120 | A1 | 1/2019 | Ohki |
| 2019/0056497 | A1 | 2/2019 | Pacala et al. |
| 2019/0178995 | A1 | 6/2019 | Tsai et al. |
| 2019/0257950 | A1 | 8/2019 | Patanwala et al. |
| 2019/0277952 | A1 | 9/2019 | Beuschel et al. |
| 2020/0314294 | A1 | 10/2020 | Schoenlieb et al. |

FOREIGN PATENT DOCUMENTS

| | | |
|---|---|---|
| EP | 2469297 A1 | 6/2012 |
| EP | 2827175 A2 | 1/2015 |
| EP | 3285087 A1 | 2/2018 |
| EP | 3318895 A1 | 5/2018 |
| JP | H02287113 A | 11/1990 |
| JP | H0567195 A | 3/1993 |
| JP | 09197045 A | 7/1997 |
| JP | H10170637 A | 6/1998 |
| JP | H11063920 A | 3/1999 |
| JP | 2013113669 A | 6/2013 |
| KR | 101318951 B1 | 10/2013 |
| WO | 9008946 A1 | 8/1990 |
| WO | 2013028691 A1 | 2/2013 |
| WO | 2015199615 A1 | 12/2015 |
| WO | 2018122560 A1 | 7/2018 |
| WO | 2020101576 A1 | 5/2020 |
| WO | 2020201452 A1 | 10/2020 |

OTHER PUBLICATIONS

International Application # PCT/US2019/45187 search report dated Nov. 15, 2019.
U.S. Appl. No. 16/532,517 Office Action dated Oct. 14, 2020.
EP Application #20177707.5 Extended Search Report dated Nov. 12, 2020.
U.S. Appl. No. 15/844,665 office action dated Jun. 1, 2020.
U.S. Appl. No. 15/950,186 office action dated Jun. 23, 2020.
EP Application No. 20177707 Search Report dated Sep. 29, 2020.
JP Application # 2020001203 Office Action dated Feb. 4, 2021.
International Application # PCT/US2020/058760 Search Report dated Feb. 9, 2021.
TW Application # 109119267 Office Action dated Mar. 10, 2021.
CN Application #201680074428.8 Office Action dated Jun. 23, 2021.
Zhu Jian, "Research of Simulation of Super-Resolution Reconstruction of Infrared Image", abstract page, Master's Thesis, p. 1, Nov. 15, 2005.
EP Application # 17737420.4 Office Action dated Oct. 28, 2021.
KR Application # 1020200068248 Office Action dated Nov. 12, 2021.
KR Application # 1020207015906 Office Action dated Oct. 13, 2021.
IN Application # 202117029897 Office Action dated Mar. 10, 2022.
IN Application # 202117028974 Office Action dated Mar. 2, 2022.

* cited by examiner

SPAD ARRAY WITH GATED HISTOGRAM CONSTRUCTION

CROSS-REFERENCE TO RELATED APPLICATION

This application is a continuation of U.S. patent application Ser. No. 14/830,760, filed Aug. 20, 2015, which is incorporated herein by reference.

FIELD OF THE INVENTION

The present invention relates generally to electronic imaging, and particularly to devices and methods for depth mapping based on time-of-flight measurement.

BACKGROUND

Time-of-flight (TOF) imaging techniques are used in many depth mapping systems (also referred to as 3D mapping or 3D imaging). In direct TOF techniques, a light source, such as a pulsed laser, directs pulses of optical radiation toward the scene that is to be mapped, and a high-speed detector senses the time of arrival of the radiation reflected from the scene. The depth value at each pixel in the depth map is derived from the difference between the emission time of the outgoing pulse and the arrival time of the reflected radiation from the corresponding point in the scene, which is referred to as the "time of flight" of the optical pulses.

Single-photon avalanche diodes (SPADs), also known as Geiger-mode avalanche photodiodes (GAPDs), are detectors capable of capturing individual photons with very high time-of-arrival resolution, of the order of a few tens of picoseconds. They may be fabricated in dedicated semiconductor processes or in standard CMOS technologies. Arrays of SPAD sensors, fabricated on a single chip, have been used experimentally in 3D imaging cameras. Charbon et al. provide a useful review of SPAD technologies in "SPAD-Based Sensors," published in TOF Range-Imaging Cameras (Springer-Verlag, 2013), which is incorporated herein by reference.

For depth mapping with fine distance resolution, very fine temporal resolution of the TOF is needed. For example, for a distance resolution of 1 mm, the arrival time of the light pulses at the detector must be discriminated with a resolution of 6.6 ps. SPAD devices at room temperature, however, generally cannot reach this low level of time uncertainty. To overcome this problem, averaging and multi-measurement techniques have been proposed, such as time-correlated single-photon counting (TCSPC). In this technique, each measurement cycle begins with a START or synchronization signal, and concludes with a STOP signal provided by the SPAD upon arrival of the first photon in the cycle (assuming a photon arrives before the next cycle starts). A histogram of arrival times is typically built up over many cycles of this sort, and is then processed to locate the statistical peak.

SUMMARY

Embodiments of the present invention that are described hereinbelow provide improved methods and devices for time of arrival sensing.

There is therefore provided, in accordance with an embodiment of the invention, a sensing device, including a first array of sensing elements. Each sensing element is configured to output a signal indicative of a time of incidence of a single photon on the sensing element during a certain gating interval in each of a succession acquisition periods. A second array of processing circuits are coupled respectively to the sensing elements. The processing circuits include a gating generator, which is configured to variably set a start time of the gating interval for each sensing element within each acquisition period, and a memory, which is coupled to record the time of incidence of the single photon on each sensing element in each acquisition period, responsively to the signal. A controller is configured to control the gating generator during a first sequence of the acquisition periods so as to sweep the gating interval over the acquisition periods and to identify, responsively to the signal from each sensing element during the first sequence of the acquisition periods, a respective detection window for the sensing element, and during a second sequence of the acquisition periods, following the first sequence, to fix the gating interval for each sensing element to coincide with the respective detection window.

In a disclosed embodiment, the sensing elements include single-photon avalanche diodes (SPADs).

In one embodiment, the first array includes a first two-dimensional matrix of the sensing elements formed on a first semiconductor chip, and the second array includes a second two-dimensional matrix of the processing circuits formed on a second semiconductor chip and coupled to the first matrix in a one-to-one correspondence between the sensing elements and the processing circuits.

Typically, the processing circuits are configured to set different, respective detection windows for different ones of the sensing elements. Additionally or alternatively, the processing circuits are configured to sweep the gating interval during the first sequence of the acquisition periods during each frame among a series of image frames, to identify the respective detection window for each sensing element in each frame, responsively to the signal during the first sequence of the acquisition periods in the frame, such that the detection window for at least some of the sensing elements changes over the series of the image frames.

In some embodiments, the processing circuits include a respective time-to-digital converter (TDC) coupled to receive the signal from each sensing element and to increment, responsively to the signal, a count in the memory of respective times of incidence of photons on the sensing element. Typically, the memory is configured to store respective counts of the photons that arrive in a plurality of different time bins within the detection window during the second sequence of the acquisition periods. The controller is configured to process a histogram of the respective counts over the different time bins for each sensing element so as to derive and output a respective time-of-arrival value for the sensing element.

In some embodiments, the device includes a radiation source, which is configured to direct a train of pulses of radiation, synchronized with the acquisition periods, toward an object, wherein the sensing elements are configured to detect photons of the radiation reflected from the object, and wherein the processing circuits are configured to measure times of flight of the photons.

There is also provided, in accordance with an embodiment of the invention, a method for sensing, which includes providing a first array of sensing elements, each sensing element configured to output a signal indicative of a time of incidence of a single photon on the sensing element during a certain gating interval in each of a succession acquisition periods. A second array of processing circuits are coupled respectively to the sensing elements. The processing circuits include a gating generator, which is configured to variably set a start time of the gating interval for each sensing element within each acquisition period, and a memory, which is coupled to record the time of incidence of the single photon on each sensing element in each acquisition period, responsively to the signal. The gating generator is controlled during a first sequence of the acquisition periods so as to sweep the gating interval over the acquisition periods. Responsively to the signal from each sensing element during the first sequence of the acquisition periods, a respective detection window is identified for each sensing element. During a second sequence of the acquisition periods, following the first sequence, the gating generator is controlled so as to fix the gating interval for each sensing element to coincide with the respective detection window.

The present invention will be more fully understood from the following detailed description of the embodiments thereof, taken together with the drawings in which:

DETAILED DESCRIPTION OF EMBODIMENTS

To create depth maps using TCSPC over an array of SPAD sensors, a histogram of photon arrival times must be created for each pixel, and then processed in order to extract the TOF value for that pixel. The precision of the TOF measurement, and hence of the depth values in the map, depends upon the temporal resolution of the histogram bins. Therefore, to achieve high precision over a large depth range, a very large histogram memory would be required. For a single SPAD or a small array, this memory can be separated from the SPAD detection area. For larger SPAD arrays, however, practical designs require that the memory for each pixel be immediately adjacent to the sensor area of the pixel. Limitations on pixel size, however, place a severe limit on the size of the memory in each pixel, and thus on the temporal resolution of TOF measurement.

Embodiments of the present invention that are described herein address this problem by using adaptively gated detection, so that memory resources are applied selectively at each pixel in each depth mapping frame. Specifically, each frame is divided into two phases: a coarse measurement phase, in which the approximate TOF value for the pixel is estimated, followed by a fine measurement phase, in which a TOF histogram is captured within a narrow measurement window that is set on the basis of the approximate TOF found in the coarse phase. The histogram can thus be constructed with high resolution within the measurement window, while ignoring arrival times outside the measurement window and thus limiting the size of the memory required in each pixel. The use of this sort of gated detection is also advantageous in reducing the effect of background photons on TOF measurement, since photons arriving at the sensing elements before the gating period in any given acquisition period will be ignored.

The disclosed embodiments provide a sensing device, comprising an array of sensing elements, such as SPADs, and an array of processing circuits, which are coupled respectively to the sensing elements. The SPADs are gated by gating generators in the corresponding processing circuits, and thus detect photons only during a certain gating interval, which can be varied from one acquisition period to the next. Each acquisition period is timed to begin, for example, when a radiation source, such as a laser, outputs a pulse of radiation, and each measurement frame of the sensing device comprises a succession of many such acquisition periods. A controller chooses the gating interval for each pixel in each acquisition period and instructs the gating generator to set the start time of the gating interval accordingly. Each sensing element then outputs a signal indicative of the time of incidence of a single photon on the sensing element during the gating interval. The processing circuits also comprise a memory, which records the time of incidence of the single photon on each sensing element in each acquisition period.

The controller is responsible for implementing the coarse and fine measurement phases. In the coarse measurement phase, covering a first sequence of acquisition periods in each frame, the controller sweeps the gating interval over the acquisition periods, in order to test a range of different gating intervals. Based on the signals output by the sensing elements during this first sequence of the acquisition periods, the controller identifies a respective detection window for each sensing element, which typically corresponds to the gating interval in which the largest number of photons was received. The detection window thus identified for each sensing element gives the TOF for the corresponding pixel with coarse resolution.

When this coarse measurement is completed, the fine measurement phase begins, comprising a second sequence of acquisition periods, following the first sequence. In the fine measurement phase, the controller fixes the gating interval for each sensing element to coincide with the respective detection window that was found in the coarse measurement phase. Typically, the detection windows will differ from pixel to pixel, and the gating intervals of different sensing elements are accordingly set to different values during the fine measurement phase. Furthermore, the detection window that is identified for each pixel during the coarse measurement phase of each frame, and thus the detection window that is applied in the fine measurement phase, can typically change over the series of the image frames.

In some embodiments, the processing circuits coupled to each SPAD sensing element in the array comprise a respective time-to-digital converter (TDC). In response to the signals from the sensing element, the TDC increments counts in the pixel memory of the respective times of incidence of photons on the sensing element. During the fine measurement phase, the memory of each pixel stores respective counts of the photons that arrive at the sensing element in multiple different time bins, which span the detection window that the controller set for this pixel. At the conclusion of the frame, the controller processes the histogram of the respective counts stored in the pixel memory in order to derive and output the respective time-of-arrival value for the corresponding sensing element.

In the disclosed embodiments, the sensing elements are arranged in a two-dimensional matrix array, formed on a semiconductor chip. The processing circuits are also arranged in a two-dimensional matrix, typically on a second semiconductor chip, and are coupled to the matrix of sensing elements in a one-to-one correspondence, using chip stacking techniques, for example. Alternatively, the sensing elements and processing circuits may be fabricated together on a single chip.

For the sake of clarity and concreteness, the embodiments described hereinbelow focus on a particular implementation and application of SPAD arrays in depth mapping. The principles of the present invention, however, may alternatively be implemented in other device types and system architectures and may be used in other applications in which accurate measurement is needed of times of arrival of photons at an array of locations. All such alternative implementations and applications are considered to be within the scope of the present invention.

Figure 1:
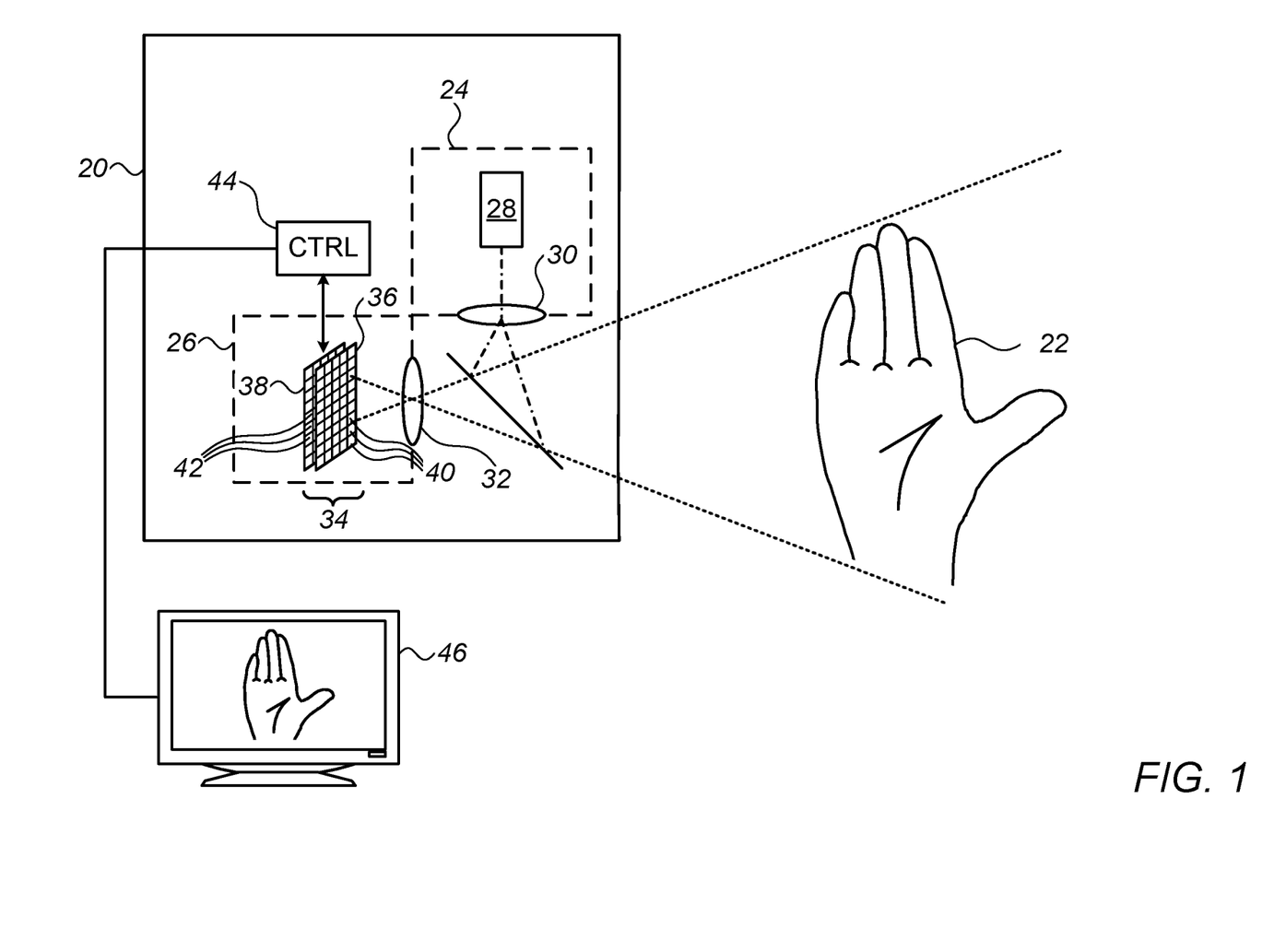
FIG. 1 is a schematic side view of a depth mapping device, in accordance with an embodiment of the invention.

FIG. 1 is a schematic side view of a depth mapping device 20, in accordance with an embodiment of the invention. In the pictured embodiment, device 20 is used to generate depth maps of an object 22, for example a part of the body of a user of the device for purposes of gesture recognition. To generate the depth map, an illumination assembly 24 directs pulses of light toward object 22, and an imaging assembly 26 measures the TOF of the photons reflected from the object. (The term "light," as used in the present description and in the claims, refers to optical radiation, which may be in any of the visible, infrared, and ultraviolet ranges.) Illumination assembly 24 typically comprises a pulsed laser 28, which emits short pulses of light, with pulse duration in the picosecond range and repetition frequency in the range of 1-10 MHz. Collection optics 30 direct the light toward object 22. Alternatively, other pulse durations and repetition frequencies may be used, depending on application requirements.

Imaging assembly 26 comprises objective optics 32, which image object 22 onto a sensing array 34, so that photons emitted by illumination assembly 24 and reflected from object 22 are incident on the sensing device. In the pictured embodiment, sensing array 34 comprises a sensor chip 36 and a processing chip 38, which are coupled together, for example, using chip stacking techniques that are known in the art. Sensor chip 36 comprises an array of sensing elements 40, such as SPAD sensors, each of which outputs a signal indicative of a time of incidence of a single photon on the sensing element during a gating interval in each of a succession of acquisition periods. Processing chip 38 comprises an array of processing circuits 42, which are coupled respectively to the sensing elements. Both of chips 36 and 38 may be produced from silicon wafers using well-known CMOS fabrication processes, based on SPAD sensor designs that are known in the art, along with accompanying drive circuits, logic and memory as described herein. Alternatively, the designs and principles of detection that are described herein may be implemented, mutatis mutandis, using other materials and processes. All such alternative implementations are considered to be within the scope of the present invention.

Imaging device 20 is timed to capture TOF information continually over a series of image frames, for example at a rate of thirty frames/sec. In each frame, each of processing circuits 42 counts photons that are incident on the corresponding sensing element 40 in a plurality of different time bins and constructs a histogram of the respective counts over the different time bins, using coarse and fine measurement phase as noted above. On the basis of this histogram, each processing circuit derives and outputs a respective time-of-arrival value for its corresponding sensing element. A system controller 44 reads out the individual pixel values and generates an output depth map, comprising the measured TOF—or equivalently, the measured depth value—at each pixel. The depth map is typically conveyed to a receiving device 46, such as a display or a computer or other processor, which segments and extracts high-level information from the depth map.

Figure 2:
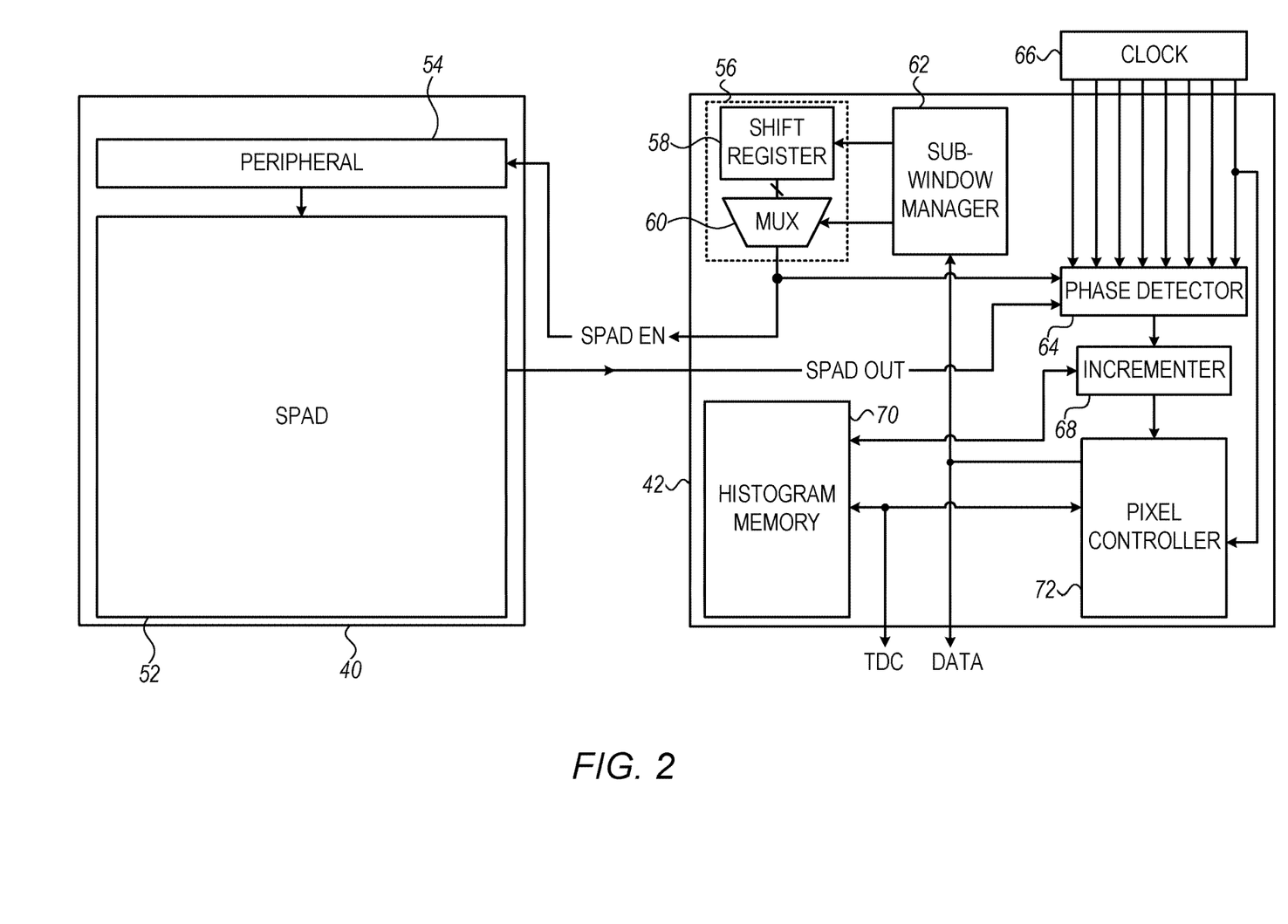
FIG. 2 is a block diagram showing components of a pixel in a SPAD array, in accordance with an embodiment of the invention.

FIG. 2 is a block diagram showing components of a detection pixel 50, comprising a single sensing element 40 and the corresponding processing circuit 42 for a single pixel in sensing array 34, in accordance with an embodiment of the invention. Sensing element 40 comprises a SPAD 52, with peripheral circuits 54 that issue driving signals to the SPAD, such as quenching and gating signals. In the pictured embodiment, peripheral circuits 54 are located on the same chip 36 as SPAD 52, but the peripheral circuits may alternatively be located on processing chip 38 with suitable inter-chip connections. SPAD 52 generates output pulses (SPAD OUT) in response to incident photons only during short gating intervals that are defined by the driving signals from peripheral circuits 54. Photons incident outside the gating interval have no effect on the SPAD output.

Processing circuit 42 for each sensing element 40 comprises logic circuits that provide the necessary timing signals to sensing element 40 (SPAD EN) and process the pulses output by SPAD 52 (SPAD OUT). Processing circuit 42 comprises a gating signal generator 56, which comprises, in the present example, a shift register 58, such as an eight-bit shift register, with a multiplexer 60 to produce output pulses at the time within each acquisition interval that is indicated by the shift register value. Alternatively, gating signal generator 56 may comprise a counter and decoder, a look-up table, or other suitable components that are known in the art. A sub-window manager circuit 62 controls the settings of gating signal generator 56 under the command of a pixel controller 72.

Thus, as explained in greater detail hereinbelow, during the initial part of each measurement frame, sub-window manager circuit 62 first sweeps the gating interval across the acquisition period during the coarse measurement phase. Based on the measurement results in this phase, controller 72 identifies the optimal detection window for this pixel 50. Controller 72 then instructs circuit 62 to set the gating interval for the fine measurement interval, which will occupy the remainder of the frame, to coincide with this detection window.

A phase detector 64 receives pulses that are output by SPAD 52 in response to the incident photons during each gating interval, and measures the pulse timing relative to a clock signal provided by a clock generator 66 (which typically serves the entire processing chip 38). To provide the desired sub-nanosecond resolution, the clock signal may comprise multiple phases, for example, eight phases, on respective input lines to phase detector 64. Following each pulse from SPAD 52, an incrementer 68 converts the pulse timing output provided by detector 64 to an address in a histogram memory 70 and increments the count value at this address in the memory. Phase detector 64 and incrementer 68 thus function as a time-to-digital converter (TDC), converting the arrival time of pulses from SPAD 52 within the detection window to corresponding count values in memory 70.

On this basis, memory 70 records the times of incidence of photons on SPAD 52 in the form of a histogram. In a typical implementation, the histogram comprises, for example, $2^4$ or $2^5$ bins, with a time resolution of 250 ps/bin. The histogram generated during the fine measurement phase covers only the detection window, rather than the entire acquisition period, and the times of the histogram bins are offset relative to the laser pulses by a delay determined by the gating set by sub-window manager circuit 62. By virtue of the combination of coarse and fine measurements, the effective temporal resolution of the TDC and histogram data are thus in the range of seven or eight bits, with a depth, for example, of sixteen bits per bin.

The histogram of the respective counts over the different time bins, along with the detection window offset, for each sensing element 40 is processed in order to derive and output a respective time-of-arrival value for the corresponding pixel. Controller 72 may be configured to perform the necessary histogram processing, so that only the time-of-arrival value need be output from each processing circuit 42. Alternatively or additionally, the histogram data and window offset may be output for analysis by a separate, more powerful processor, such as controller 44.

Although FIG. 2 shows certain specific implementations of the gating signal generation and TDC functions of processing circuits 42, other implementations will be apparent to those skilled in the art and are considered to be within the scope of the present invention. Furthermore, although the pictured embodiment and the associated description refer to an implementation in which each pixel of sensing array 34 has its own, dedicated processing circuit, the processing circuits in array 34 may alternatively be shared among multiple pixels.

Figure 3:
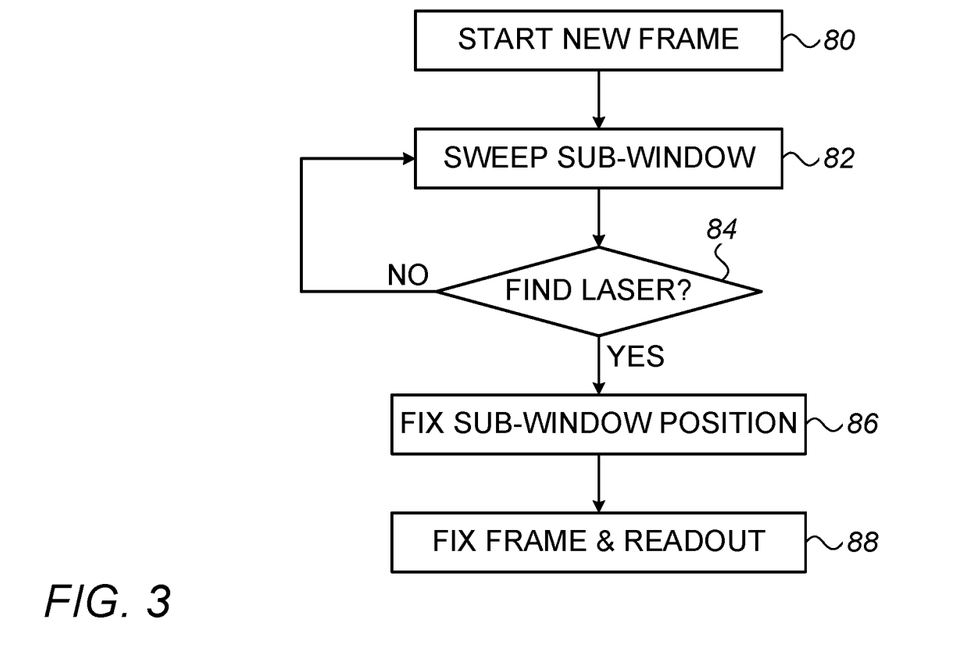
FIG. 3 is a flow chart that schematically illustrates a method for TOF measurement, in accordance with an embodiment of the invention.
Figure 4:
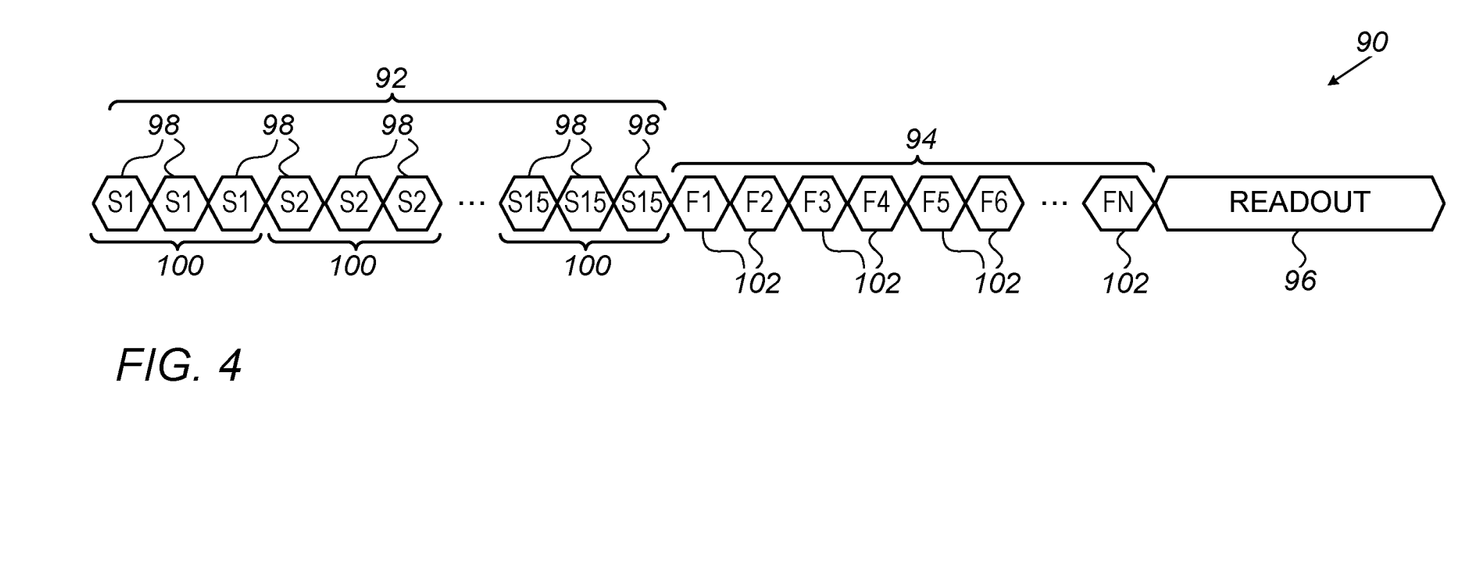
FIG. 4 is a timing diagram, which schematically illustrates phases in the operation of a SPAD sensor, in accordance with an embodiment of the invention.

Reference is now made to FIGS. 3 and 4, which schematically illustrate a method for TOF measurement, in accordance with an embodiment of the invention. FIG. 3 is a flow chart, while FIG. 4 is a timing diagram, which shows phases of the operation of sensing array 34 in carrying out the method. The method is described, for the sake of convenience and clarity, with reference to the elements of depth mapping device 20, and specifically sensing array 34, but the principles of this method may be implemented using substantially any suitable array of sensing elements and processing circuits. The method is performed individually for each detection pixel 50 in array 34, and the steps of FIG. 3 and the description below thus refer to the processing that takes place within a single pixel.

The method of FIGS. 3 and 4 is typically performed repetitively over a series of image frames. FIG. 4 illustrates a typical frame 90 in the series, which begins at a frame start step 80. Each frame 90 comprises a succession of acquisition periods 98, 102, each of which is synchronized to begin with emission of a pulse of light from illumination assembly 24. Assuming laser 28 to operate at a repetition rate of 1-10 MHz, the total duration of each acquisition period is 100-1000 ns. Thus, at 30 frames/sec, for example, each frame comprises between about 30,000 and 300,000 acquisition periods. (In general, however, only a part of each acquisition period is actually used for pulse acquisition, depending on the range of depth mapping device 20, and the remainder of the acquisition period can be used for reset, control and processing.)

In a coarse measurement phase 92, sub-window manager 62 sweeps the gating interval of all sensing elements 40 in array 34 across the duration of acquisition periods 98, at a sub-window sweeping step 82. In other words, for the sequence of acquisition periods 98, sub-window manager 62 successively sets the gating interval to occur at different delay values relative to the laser pulse that starts the acquisition period. These delay values are labeled in the figure as S1, S2, . . . , S15, typically with a group 100 of acquisition periods 98 assigned to each different delay value. For example, the start times of the gating periods in successive groups 100 may be incremented by 1-10 ns from one group to the next, depending on the desired time resolution. To avoid possible edge effects, the delay values and gating periods are chosen so that the successive gating intervals, at different delay values, partially overlap. Although only three acquisition periods 98 are shown in each group 100 in FIG. 4, in practice the number of acquisition periods in each group is typically many times larger.

When pulses from SPAD 52 reach phase detector 64 during coarse measurement phase 92, incrementer 68 updates the count in memory 70 corresponding to the current gating interval set by sub-window manager. Thus, at the conclusion of phase 92, memory 70 will contain a histogram of pulse arrival counts per gating interval. Pixel controller 72 processes this histogram in order to identify the gating interval in which SPAD 52 actually received reflected laser pulses, at a laser finding step 84. Controller 72 considers acquisition in phase 92 to have been successful if for a single group 100 of acquisition periods 98 (or possibly two adjacent groups), the count in the corresponding histogram bin is significantly higher than a baseline count averaged over the other bins. If no such dominant bin is found in the histogram in memory 70 at step 84, controller 72 may instruct sub-window manager to return to step 82 and perform a further sweep. Alternatively, controller 72 may output a null TOF value for the pixel in question in this frame.

Assuming controller 72 is successful in finding a gating interval at step 84 that satisfies the count criterion, the controller identifies this gating interval as the detection window for pixel 50. (When significant counts are collected in two adjacent gating intervals during coarse measurement phase 92, controller 72 can set the detection window to an intermediate time delay, between the two gating intervals.) Controller 72 instructs sub-window manager 62 to fix the gating interval for pixel 50 to coincide with this detection window for the duration of a fine measurement phase 94, at a window-fixing step 86. Typically, different pixels will have different detection windows, depending on the actual distance of the corresponding point on object 22 from device 20, and moreover, the detection window for any given pixel will vary from frame to frame if and as the object moves.

During the next sequence of acquisition periods 102, in fine measurement phase 94 (marked F1, F2, . . . , Fn), phase detector 64 and incrementer 68 build a histogram of time of arrival values in memory 70, with bins spanning the detection window. This process continues until the conclusion of the current frame, at a measurement completion step 88. During a subsequent readout period 96, the histogram values are read out of memory 70 to pixel controller 72 or to controller 44, which processes the histogram at each pixel in order to extract the corresponding TOF value.

Figure 5:
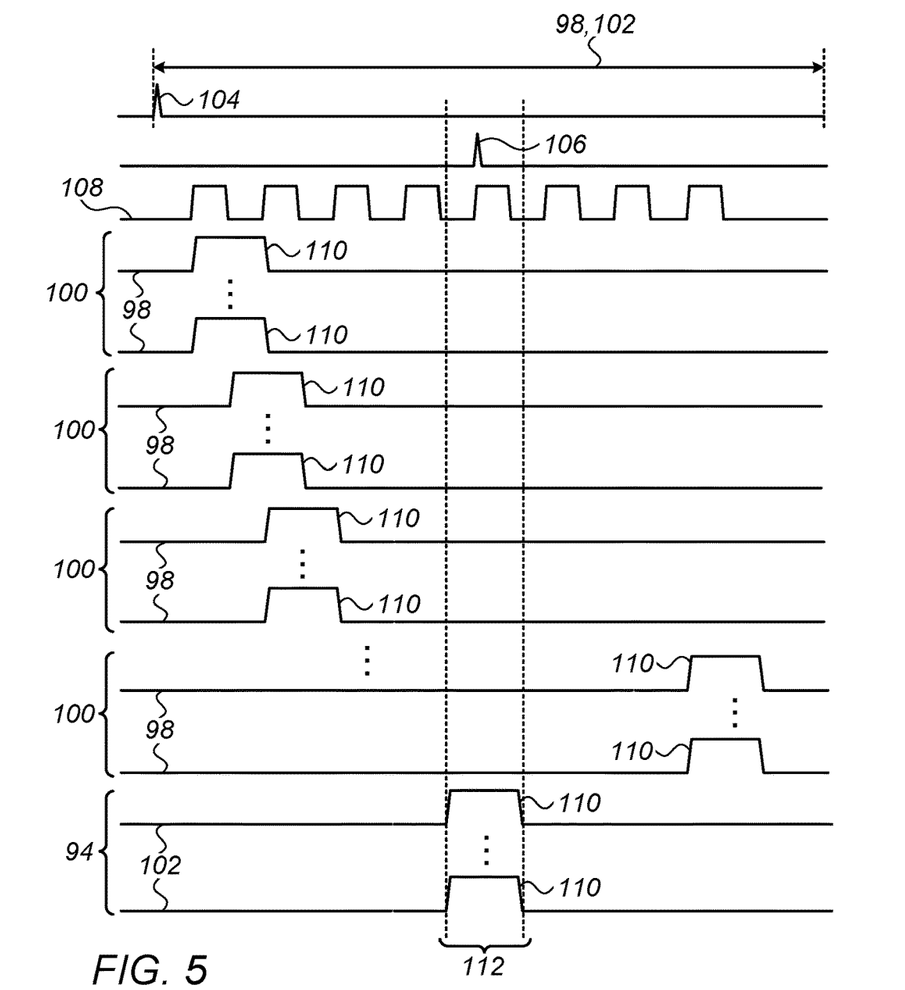
FIG. 5 is a plot that schematically shows signals associated with the operation of a depth mapping device, in accordance with an embodiment of the invention.

FIG. 5 is a plot that schematically shows signals associated with the operation of depth mapping device 20, based on the method of FIGS. 3 and 4, in accordance with an embodiment of the invention. Each acquisition period 98 or 102 is synchronized to begin with a pulse 104 of laser emission. Sensing element 40 emits a pulse 106 in response to the first photon that reaches the corresponding SPAD 52 within each gating interval 110 set by gating signal generator 56. Phase detector 64 generates an output to incrementer 68 by comparing the arrival time of pulse 106 to a clock signal 108 received from clock generator 66.

In coarse phase 92, gating intervals 110 are set to different delays, relative to pulse 104, for different groups 100 of acquisition periods 98. In the pictured example, the gating interval for each group 100 overlaps by about 50% with the preceding group. Assuming the gating intervals each to have a duration of 4 ns, for example, a series of fifteen groups 100 of this sort will thus span a range of 30 ns within each acquisition period. At the conclusion of phase 92 (step 86 in FIG. 3), controller 72 identifies a detection window 112 for this pixel in the current frame. Subsequently, during acquisition periods 102 in fine measurement phase 94, sub-window manager 62 sets gating interval 110 to coincide with detection window 112, as illustrated by the final traces in FIG. 5.

Figure 6:
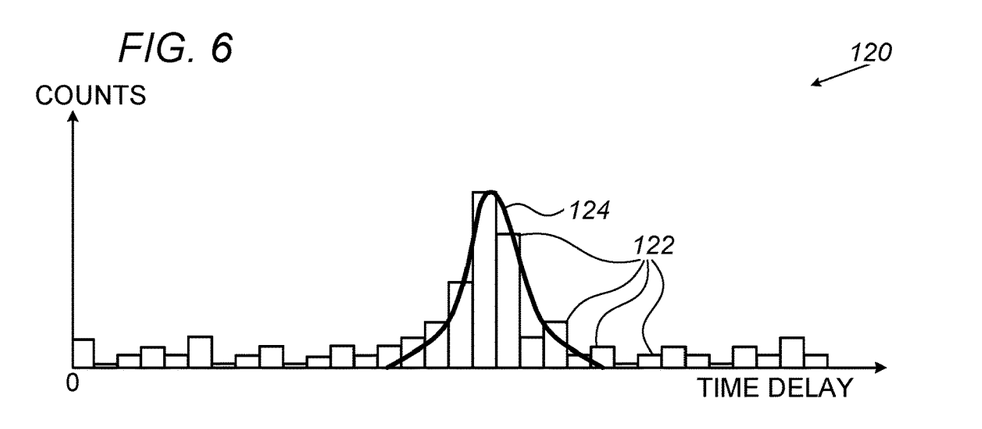
FIG. 6 is a plot that schematically illustrates a histogram generated by a SPAD sensor, in accordance with an embodiment of the invention.

FIG. 6 is a plot that schematically illustrates a histogram 120 generated in memory 70 of a given pixel 50 in array 34 during fine measurement phase 94, in accordance with an embodiment of the invention. Each bin 122 contains the count of photons received by SPAD 52 at a corresponding time delay within gating interval 110 (which is set to coincide with detection window 112). The time of arrival for this pixel corresponds to a peak 124 of the histogram. Assuming the duration of the gating interval to be 4 ns, as in the example described above, and histogram 120 to comprise sixty-four or one hundred twenty-eight bins 122, the temporal resolution of the measurement can be in the range of 30-60 ps.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A sensing device, comprising:
   a first array of sensing elements, each sensing element configured to output a signal indicative of a time of incidence of a single photon on the sensing element during a certain gating interval in each of a succession acquisition periods; and
   a second array of processing circuits, which are coupled respectively to the sensing elements and comprise:
   a gating generator, which is configured to variably set a start time of the gating interval for each sensing element within each acquisition period;
   a memory, which is coupled to record the time of incidence of the single photon on each sensing element in each acquisition period, responsively to the signal; and
   a controller, which is configured to set, in each of at least some of the acquisition periods, different, respective gating intervals for different ones of the sensing elements and to modify the gating intervals such that the respective gating intervals for at least some of the sensing elements change over a series of image frames.

2. The device according to claim 1, and comprising a radiation source, which is configured to direct a train of pulses of radiation, synchronized with the acquisition periods, toward a scene,
   wherein the sensing elements are configured to detect photons of the radiation reflected from the scene, and wherein the processing circuits are configured to measure times of flight of the photons.

3. The device according to claim 2, wherein the times of flight are indicative of depths of objects in the scene, and the controller is configured to set the different, respective gating intervals responsively to the depths.

4. The device according to claim 2, wherein the controller is configured to control the gating generator during a first sequence of the acquisition periods so as to sweep the gating interval over the acquisition periods and to identify, responsively to the signal from each sensing element during the first sequence of the acquisition periods, a respective detection window for the sensing element, and during a second sequence of the acquisition periods, following the first sequence, to fix the gating interval for each sensing element to coincide with the respective detection window.

5. The device according to claim 1, wherein the sensing elements comprise single-photon avalanche diodes (SPADs).

6. The device according to claim 1, wherein the first array comprises a first two-dimensional matrix of the sensing elements formed on a first semiconductor chip, and wherein the second array comprises a second two-dimensional matrix of the processing circuits formed on a second semiconductor chip and coupled to the first matrix in a one-to-one correspondence between the sensing elements and the processing circuits.

7. The device according to claim 1, wherein the processing circuits comprise a respective time-to-digital converter (TDC) coupled to receive the signal from each sensing element and to increment, responsively to the signal, a count in the memory of respective times of incidence of photons on the sensing element.

8. The device according to claim 7, wherein the memory is configured to store respective counts of the photons that arrive in a plurality of different time bins within the gating interval during the succession of the acquisition periods.

9. The device according to claim 8, wherein the controller is configured to process a histogram of the respective counts over the different time bins for each sensing element so as to derive and output a respective time-of-arrival value for the sensing element.

10. A method for sensing, comprising:
    providing a first array of sensing elements, each sensing element configured to output a signal indicative of a time of incidence of a single photon on the sensing element during a certain gating interval in each of a succession acquisition periods;
    coupling a second array of processing circuits respectively to the sensing elements, the processing circuits comprising a gating generator, which is configured to variably set a start time of the gating interval for each sensing element within each acquisition period, and a memory, which is coupled to record the time of incidence of the single photon on each sensing element in each acquisition period, responsively to the signal; and
    controlling the gating generator so as to set, in each of at least some of the acquisition periods, different, respective gating intervals for different ones of the sensing elements and to modify the gating intervals such that the respective gating intervals for at least some of the sensing elements changes over a series of image frames.

11. The method according to claim 10, and comprising directing a train of pulses of radiation, synchronized with the acquisition periods, toward a scene, wherein the sensing elements are configured to detect photons of the radiation reflected from the scene, and wherein the processing circuits are configured to measure times of flight of the photons responsively to the signals.

12. The method according to claim 11, wherein the times of flight are indicative of depths of objects in the scene, and wherein controlling the gating generator comprises setting the different, respective gating intervals responsively to the depths.

13. The method according to claim 11, wherein controlling the gating generator comprises:
during a first sequence of the acquisition periods, sweeping the gating interval over the acquisition periods; identifying, responsively to the signal from each sensing element during the first sequence of the acquisition periods, a respective detection window for each sensing element; and
during a second sequence of the acquisition periods, following the first sequence, fixing the gating interval for each sensing element to coincide with the respective detection window.

14. The method according to claim 10, wherein the sensing elements comprise single-photon avalanche diodes (SPADs).

15. The method according to claim 10, wherein the first array comprises a first two-dimensional matrix of the sensing elements formed on a first semiconductor chip, and wherein the second array comprises a second two-dimensional matrix of the processing circuits formed on a second semiconductor chip, and wherein the second matrix is coupled to the first matrix in a one-to-one correspondence between the sensing elements and the processing circuits.

16. The method according to claim 10, and comprising incrementing, in response to the signal from each sensing element, a count in the memory of respective times of incidence of photons on the sensing element.

17. The method according to claim 16, wherein incrementing the count comprises storing in the memory respective counts of the photons that arrive in a plurality of different time bins within the gating interval during the succession of the acquisition periods.

18. The method according to claim 17, and comprising reading from the memory and processing a histogram of the respective counts over the different time bins for each sensing element so as to derive and output a respective time-of-arrival value for the sensing element.

* * * * *